(12) United States Patent
Ohnishi et al.

(10) Patent No.: US 10,113,083 B2
(45) Date of Patent: Oct. 30, 2018

(54) RESIST UNDERLAYER FILM-FORMING COMPOSITION CONTAINING POLYMER WHICH CONTAINS NITROGEN-CONTAINING RING COMPOUND

(71) Applicant: Nissan Chemical Industries, Ltd., Tokyo (JP)

(72) Inventors: Ryuji Ohnishi, Toyama (JP); Ryuta Mizuochi, Toyama (JP); Tokio Nishita, Toyama (JP); Yasushi Sakaida, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/910,787

(22) PCT Filed: Aug. 1, 2014

(86) PCT No.: PCT/JP2014/070357
§ 371 (c)(1),
(2) Date: Feb. 8, 2016

(87) PCT Pub. No.: WO2015/019961
PCT Pub. Date: Feb. 12, 2015

(65) Prior Publication Data
US 2016/0186006 A1    Jun. 30, 2016

(30) Foreign Application Priority Data
Aug. 8, 2013    (JP) .................... 2013-165111

(51) Int. Cl.
| C09D 167/06 | (2006.01) |
| C08G 59/42 | (2006.01) |
| G03F 7/09 | (2006.01) |
| C09D 5/00 | (2006.01) |
| H01L 21/027 | (2006.01) |

(52) U.S. Cl.
CPC ............ *C09D 167/06* (2013.01); *C08G 59/42* (2013.01); *C09D 5/006* (2013.01); *G03F 7/091* (2013.01); *H01L 21/0276* (2013.01)

(58) Field of Classification Search
CPC .................................................. C09D 167/06
See application file for complete search history.

(56) References Cited

U.S. PATENT DOCUMENTS

| 7,632,626 B2 * | 12/2009 | Sakamoto .......... C08G 59/4207 430/271.1 |
| 2014/0170567 A1 * | 6/2014 | Sakamoto ............. C08G 73/06 430/319 |

FOREIGN PATENT DOCUMENTS

| JP | 2009-093162 A | 4/2009 |
| JP | 2009-175436 A | 8/2009 |
| WO | 2005/098542 A1 | 10/2005 |
| WO | 2006/115074 A1 | 11/2006 |
| WO | 2009/008446 A1 | 1/2009 |
| WO | 2009/104685 A1 | 8/2009 |
| WO | 2012/169580 A1 | 12/2012 |
| WO | 2013/018802 | * 2/2013 |
| WO | 2013/018802 A1 | 2/2013 |

OTHER PUBLICATIONS

Sep. 2, 2014 International Search Report issued in International Patent Application No. PCT/JP2014/070357.
Sep. 2, 2014 Written Opinion of the International Searching Authority issued in International Patent Application No. PCT/JP2014/070357.

* cited by examiner

*Primary Examiner* — Megan McCulley
(74) *Attorney, Agent, or Firm* — Oliff PLC

(57) ABSTRACT

The present invention provides a resist underlayer film that has a wide focus position range within which a good resist shape can be obtained. A resist underlayer film-forming composition for lithography comprising a linear polymer that is obtained by a reaction of a diepoxy group-containing compound (A) with a dicarboxyl group-containing compound (B). The linear polymer has structures of the following formulae (1), (2), and (3) derived from the diepoxy group-containing compound (A) or the dicarboxyl group-containing compound (B):

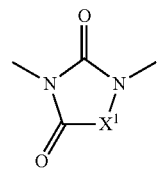

Formula (1)

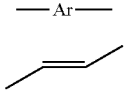

Formula (2)

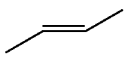

Formula (3)

The linear polymer preferably contains a polymer obtained by a reaction of two diepoxy group-containing compounds (A) each having structures of Formulae (1) and (2) with a dicarboxyl group-containing compound (B) having a structure of Formula (3), or a polymer obtained by a reaction of a diepoxy group-containing compound (A) having a structure of Formula (1) with two dicarboxyl group-containing compounds (B) each having structures of Formulae (2) and (3).

12 Claims, No Drawings

RESIST UNDERLAYER FILM-FORMING COMPOSITION CONTAINING POLYMER WHICH CONTAINS NITROGEN-CONTAINING RING COMPOUND

TECHNICAL FIELD

The present invention rotates to a composition for formation of a resist underlayer film. In particular, the present invention relates to an anti-reflective coating for reducing reflection of irradiation light for exposure of a photoresist layer that is applied to a semiconductor substrate on the semiconductor substrate in a lithography process for production of a semiconductor device, and a composition for formation of the anti-reflective coating. Specifically, the present invention relates to an anti-reflective coating used in a lithography process for production of a semiconductor device using irradiation light for exposure with a wavelength of 193 nm or the like, and a composition for formation of the anti-reflective coating. Furthermore, the present invention relates to a method for forming a photoresist pattern using the anti-reflective coating.

BACKGROUND ART

Conventionally, in production of a semiconductor device, microprocessing by lithography using a photoresist composition has been carried out. The microprocessing is a processing method in which a thin film of the photoresist composition is formed on a silicon wafer, is exposed to active light such as ultraviolet light through a mask pattern that has a pattern of the semiconductor device, and is developed, and the silicon wafer is etched using the obtained resist pattern as a protective film. In recent years, an increase in degree of integration of the semiconductor device has advanced, and the wavelength of used active light tends to shorten from an i line (wavelength: 365 nm) and a KrF excimer laser (wavelength: 248 nm) to an ArF excimer laser (wavelength: 193 nm). For this reason, diffuse reflection of active light on a substrate and effects of standing wave are sever problems. A method for providing an anti-reflective coating (Bottom Anti-Reflective Coating, BARC) between the photoresist and the substrate has been widely studied.

For a resist underlayer film having a function of such an anti-reflective coating, an anti-reflective coating-forming composition containing a condensation polymer (Patent Document 1), and an anti-reflective coating-forming composition containing a polymer having an ethylene carbonyl structure (Patent Document 2) have been known.

PRIOR ART DOCUMENTS

Patent Documents

Patent Document 1: International Publication No, 2005/098542 (WO2005/098542)
Patent Document 2: International Publication No. 2006/115074 (WO2006/115074)

SUMMARY OF THE INVENTION

Problem to be Solved by the Invention

It is an object of the present invention to provide an anti-reflective coating having strong absorption for light with a short wavelength, and particularly an ArF excimer laser (wavelength: 193 nm), and a resist underlayer film-forming composition for formation of the anti-reflective coating. It is another object of the present invention to provide a resist underlayer film that effectively absorbs reflective light from a semiconductor substrate during use of irradiation light of an ArF excimer laser (wavelength: 193 nm) in microprocessing by a lithography process and does not cause intermixing with a photoresist layer, and to provides a resist underlayer film-forming composition for formation of the resist underlayer film. Therefore, the present invention can provide a resist underlayer film that satisfies such characteristics and has a wide focus position range within which a good resist shape can be obtained.

Means for Solving the Problem

The present invention is, as a first aspect, a resist underlayer film-forming composition for lithography comprising a linear polymer that is obtained by a reaction of a diepoxy group-containing compound (A) with a dicarboxyl group-containing compound (B), in which the linear polymer has structures of the following formulae (1), (2), and (3) derived from the diepoxy group-containing compound (A) or the dicarboxyl group-containing compound (B):

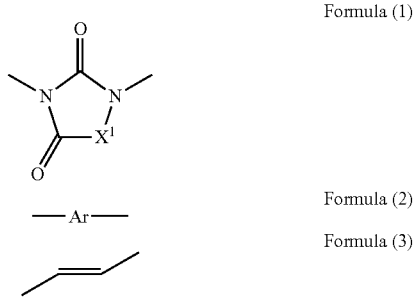

[in Formula (1), $X^1$ is a group of Formula (4), (5), or (6):

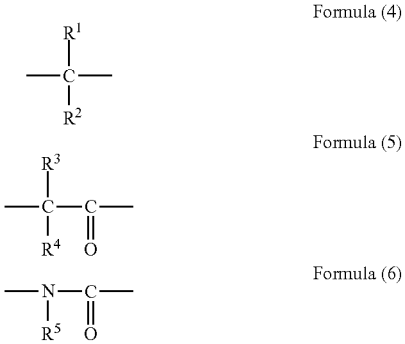

(wherein each of $R^1$, $R^2$, $R^3$, and $R^4$ is a hydrogen atom, a $C_{1-6}$ alkyl group, a $C_{3-6}$ alkenyl group, benzyl group, or phenyl group, the phenyl group may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group, and $R^1$ and $R^2$ or $R^3$ and $R^4$ may be bonded to each other to form a $C_{3-6}$ ring; and $R^5$ is a $C_{1-6}$ alkyl group, a $C_{3-6}$ alkenyl group, benzyl group, or phenyl group, and the phenyl group may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group); and Ar in Formula (2) is an aromatic $C_{6-20}$ fused ring, and the ring may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group], as a second aspect, the resist underlayer film-forming composition according to the first aspect, in which the linear polymer is a polymer obtained by a reaction of two diepoxy group-containing compounds (A) each having structures of Formulae (1) and (2) with a dicarboxyl group-containing compound (B) having a structure of Formula (3), as a third aspect, the resist underlayer film-forming composition according to the first aspect, in which the linear polymer is a polymer obtained by a reaction of a diepoxy group-containing compound (A) having a structure of Formulae (1) with two dicarboxyl group-containing compounds (B) each having structures of Formulae (2) and (3), as a fourth aspect, the resist underlayer film-forming composition according to any one of the first to third aspects, in which $X^1$ in Formula (1) is a group of Formula (4) or (6), as a fifth aspect, the resist underlayer film-forming composition according to any one of the first to fourth aspects, in which Ar in Formula (2) is a benzene ring or a naphthalene ring, as a sixth aspect, the resist underlayer film-forming composition according to any one of the first to fifth aspects, further comprising a crosslinkable compound, as a seventh aspect, the resist underlayer film-forming composition according to any one of the first to sixth aspects, further comprising an acid and/or an acid generator, as an eighth aspect, a resist underlayer film obtained by applying the resist underlayer film-forming composition as described in any one of the first to seventh aspects to a semiconductor substrate, followed by baking, as a ninth aspect, a method for producing a semiconductor device comprising steps of: applying the resist underlayer film-forming composition as described in any one of the first to seventh aspects to a semiconductor substrate, followed by baking to form a resist underlayer film; forming a photoresist film on the resist underlayer film; forming a resist pattern by exposure and development; etching the resist underlayer film according to the formed resist pattern; and processing the semiconductor substrate according to the patterned resist underlayer film.

Effects of the Invention

The polymer used for the resist underlayer film-forming composition of the present invention is a polymer obtained by a reaction of a diepoxy group-containing compound (A) with a dicarboxyl group-containing compound (B). By this reaction, a polymer in which a unit structure derived from an epoxy group and a unit structure derived from a carboxyl group are alternately fused is formed. Thus, a regularly arranged linear polymer is obtained. An epoxy group is reacted with a carboxyl group to form a hydroxy group, and the hydroxyl group is reacted with a crosslinkable compound using an acid compound as a catalyst to form a three-dimensional crosslinking structure. For this reason, intermixing with a resist to be applied does not occur.

The polymer used in the present invention has a unit structure having a nitrogen-containing ring derived from a structure of Formula (1), a unit structure having an aromatic fused ring derived from a structure of Formula (2), and a unit structure having an aliphatic unsaturated bond derived from a structure of Formula (3). Therefore, the resist underlayer film-forming composition of the present invention using this polymer makes it possible to appropriately control the absorption of exposure wavelength, and makes it possible to provide a wide focus position for obtaining an appropriate resist shape (wide focus depth margin).

MODES FOR CARRYING OUT THE INVENTION

The present invention provides a resist underlayer film-forming composition for lithography containing a linear polymer that is obtained by a reaction of a diepoxy group-containing compound (A) with a dicarboxy group-containing compound (B), and that has structures of the following formulae (1), (2), and (3) derived from the diepoxy group-containing compound (A) or the dicarboxyl group-containing compound (B).

In the present invention, the resist underlayer film-forming composition for lithography contains the resin and a solvent. The composition may contain a crosslinkable compound, an acid, an acid generator, a surfactant, or the like, if necessary. The solid content of the composition is 0.1 to 70% by mass, or 0.1 to 60% by mass. The solid content herein is a content ratio of all components other than the solvent in the resist underlayer film-forming composition. The solid content may contain the polymer in an amount of 1 to 100% by mass, 1 to 99.9% by mass, 50 to 99.9% by mass, 50 to 95% by mass, or 50 to 90% by mass.

The polymer used in the present invention has a weight average molecular weight of 1,000 to 1,000,000, 1,000 to 100,000, or 1,000 to 50,000.

In Formula (1), $X^1$ is Formula (4), (5), or (6). $X^1$ in Formula (1) is preferably a group of Formula (4) or (6). Ar in Formula (2) is an aromatic $C_{6-20}$ fused ring, and the ring may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group, Ar in Formula (2) is preferably a benzene ring or a naphthalene ring.

Examples of the alkyl group include methyl group, ethyl group, n-propyl group, isopropyl group, cyclopropyl group, n-butyl group, isobutyl group, sec-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-isopropyl-cyclopropyl group, 2-isopropyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group. These groups correspond to examples of an alkyl moiety of the $C_{1-6}$ alkylthio group.

Examples of the $C_{3-6}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-isopropylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-sec-butylethenyl group, 1,3-dimethyl-1-butenyl group, 1,3-dimethyl-2-butenyl group, 1,3-dimethyl-3-butenyl group, 1-isobutylethenyl group, 2,2-dimethyl-3-butenyl group, 2,3-dimethyl-1-butenyl group, 2,3-dimethyl-2-butenyl group, 2,3-dimethyl-3-butenyl group, 2-isopropyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-tert-butylethenyl group, 1-methyl-1-ethyl-2-propenyl group, 1-ethyl-2-methyl-1-propenyl group, 1-ethyl-2-methyl-2-propenyl group, 1-isopropyl-1-propenyl group, 1-isopropyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{1-6}$ alkoxy group include methoxy group, ethoxy group, n-propoxy group, isopropoxy group, n-butoxy group, isobutoxy group, sec-butoxy group, tert-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the halogen atom include a fluorine atom, a chlorine atom, a bromine atom, and an iodine atom.

Examples of the diepoxy group-containing compound (A) used for production of the polymer of the present invention include as follows.

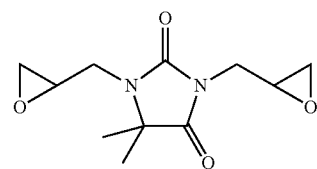

Formula (A-1)

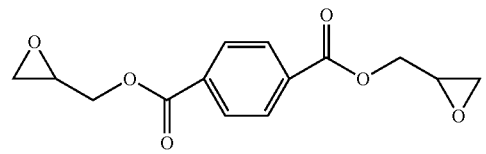

Formula (A-2)

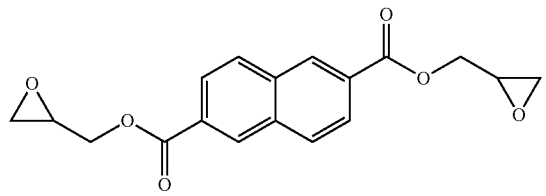

Formula (A-3)

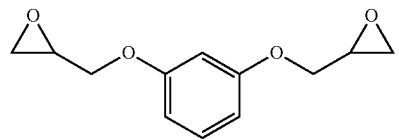

Formula (A-4)

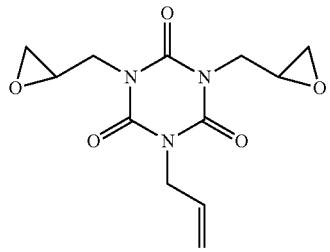

Formula (A-5)

-continued

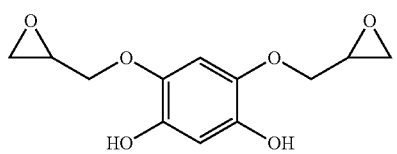
Formula (A-6)

Examples of the dicarboxyl group-containing compound (B) used for production of the polymer of the present invention include as follows.

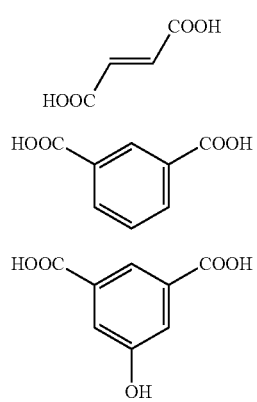

Formula (B-1)

Formula (B-2)

Fromula (B-3)

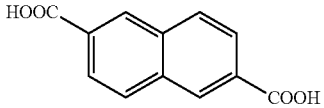
Formula (B-4)

The reaction of the diepoxy group-containing compound (A) with the dicarboxyl group-containing compound (B) is carried out by a reaction using as a solvent ethylene gylcol monomethyl ether, ethylene gylcol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluen, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate, at 50 to 160° C., and preferably 70 to 130° C. for 1, to 50 hours, and preferably 2 to 12 hours. Benzyl triethyl ammonium chloride, ethyl triphenyl hosphonium bromide, or the like can be added as a catalyst.

Examples of the linear polymer obtained by the reaction of the diepoxy group-containing compound (A) with the dicarboxyl group-containing compound (B) may include as follows.

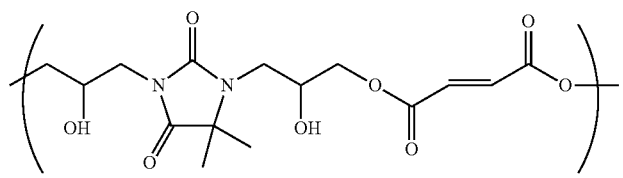
Formula (3-1)

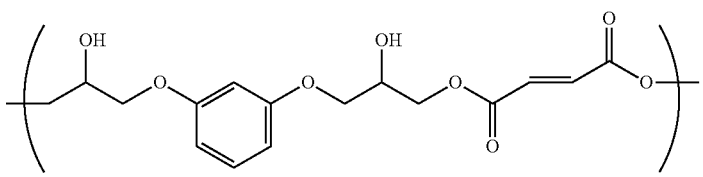

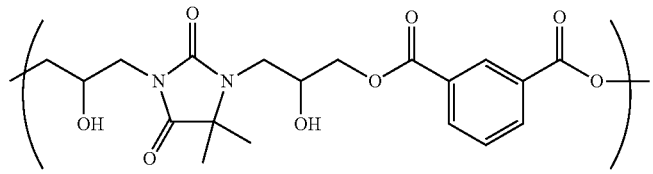
Formula (3-2)

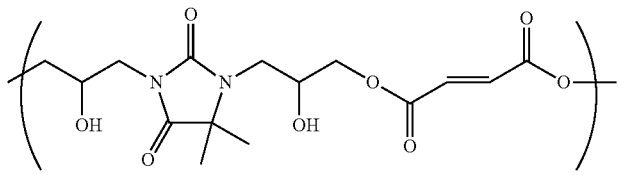

-continued
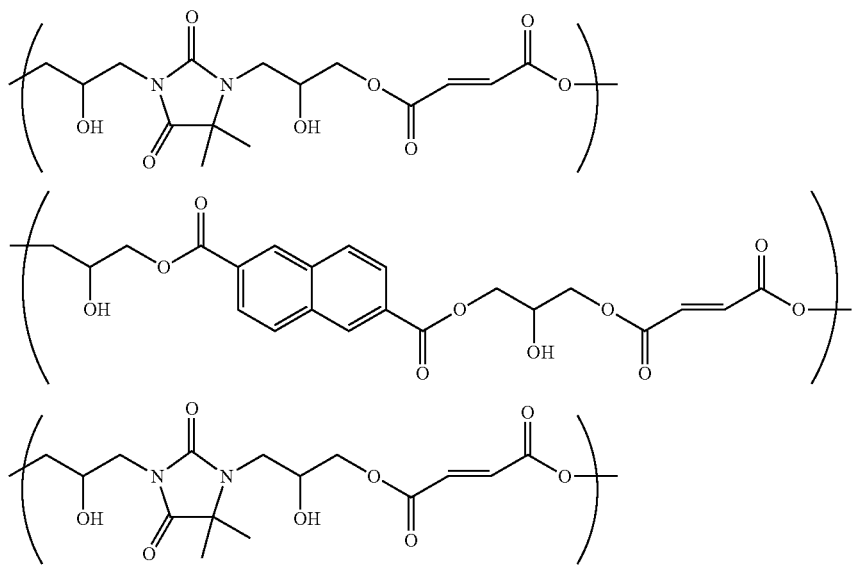
Formula (3-3)
Formula (3-4)
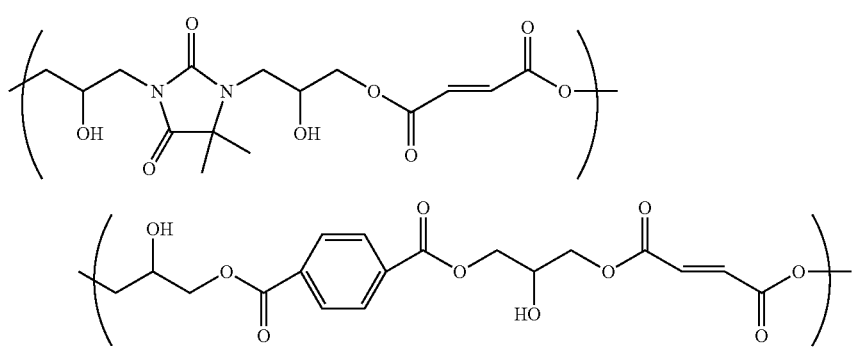
Formula (3-5)
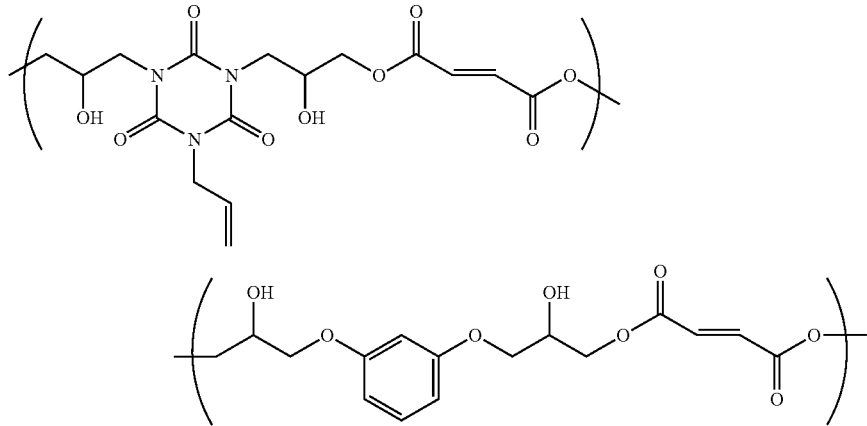
Formula (3-6)
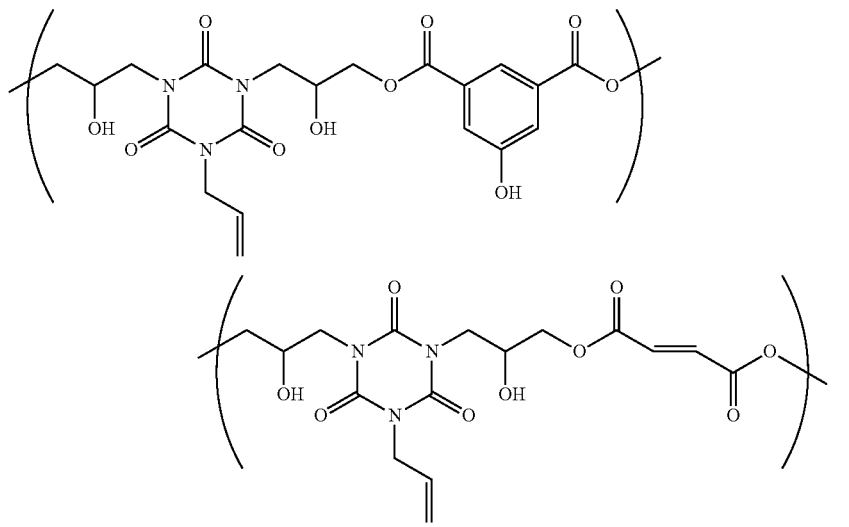

The reaction of the diepoxy group-containing compound (A) with the dicarboxyl group-containing compound (B) can be carried out at a molar ratio of 1:0.7 to 1.3, or 1:0.8 to 1.2.

The polymer may be a polymer obtained by a reaction of two kinds of diepoxy group-containing compounds (A) each having structures of Formulae (1) and (2) with a dicarboxyl group-containing compound (B) having a structure of Formula (3). The two kinds of diepoxy group-containing compounds (A) each having structures of Formulae (1) and (2) can be used for the reaction at a molar ratio of the diepoxy group-containing compound having the structure of Formula (1): the diepoxy group-containing compound having the structure of Formula (2) of 1:0.1 to 0.6 or 1:0.2 to 0.5.

The polymer may be a polymer obtained by a reaction of the diepoxy group-containing compounds (A) having a structure of Formula (1) with two kinds of dicarboxyl group-containing compounds (B) each having structures of Formulae (2) and (3). The dicarboxyl group-containing compound having the structure of Formula (2) and the dicarboxyl group-containing compound having the structure of Formula (3) can be used for the reaction at a molar ratio of the dicarboxyl group-containing compound having the structure of Formula (2): the dicarboxyl group-containing compound having the structure of Formula (3) of 1:1 to 9 or 1:2 to 7.

The resist underlayer film-forming composition of the present invention may further contain a crosslinkable compound. The crosslinkable compound is not particularly limited, and a crosslinkable compound having at least two crosslink-forming substituents is preferably used. Examples thereof include a melamine-based compound having a crosslink-forming substituent such as a methylol group and a methoxymethyl group and a substituted urea-based compound. Specific examples thereof include methoxymethylated glycoluril and methoxymethylated melamine. Further examples thereof include tetramethoxymethyl glycoluril, tetrabutoxymethyl glycoluril, and hexamethoxy methyl melamine. In addition, examples thereof include tetramethoxymethyl urea and tetrabutoxymethyl urea. The crosslinkable compounds may cause a crosslinking reaction due to self-condensation. Furthermore, the crosslinkable compounds may cause a crosslinking reaction with a hydroxyl group in the polymer of the present invention. Due to this crosslinking reaction, the formed resist underlayer film becomes rigid. Furthermore, an anti-reflective coating having low solubility in an organic solvent is formed. One of the crosslinkable compounds may be used alone, or two or more thereof may be used in combination.

The content of the crosslinkable compound in the solid content is, for example, 1 to 50% by mass, 1 to 40% by mass, or 10 to 40% by mass.

The resist underlayer film-forming composition of the present invention may, further contain an acid and/or an acid generator. Examples of the acid include sulfonic acid compounds such as p-toluenesulfonic acid, trifluoromethanesulfonic acid, and pyridinium p-toluenesulfonate, and carboxylic acid compounds such as salicylic acid, 5-sulfosalicylic acid, citric acid, benzoic acid, and hydroxybenzoic acid.

One of the acids may be used alone, or two or more thereof may be used in combination.

Examples of the acid generator include acid generators that generate an acid by heat or light such as 2,4,4,6-tetrabromocyclohexadienone, benzoin tosylate, 2-nitrobenzyl tosylate, 2,4-dinitrobenzyl p-trifluoromethylbenzenesulfonate, phenyl-bis(trichloromethyl)-s-triazine, and N-hydroxysuccinimide trifluoromethanesulfonate. Further examples of the acid generator include iodonium salt-based acid generators such as diphenyliodonium hexafluorophosphate, diphenyliodonium trifluoromethanesulfonate, and bis(4-tert-butylphenyl)iodonium trifluoromethanesulfonate, and sulfonium salt-based acid generators such as triphenylsulfonium hexafluoroantimonate and triphenylsulfonium trifluoromethanesulfonate. As the acid generator, a sulfonic acid compound, an iodonium salt-based acid generator, or a sulfonium salt-based acid generator is preferably used.

One of the acid generators may be used alone, or two or more thereof may be used in combination.

The content of the acid and/or acid generator in the solid content is, for example, 0.1 to 10% by mass, or 0.1 to 5% by mass.

The resist underlayer film-forming composition of the present invention may contain an optional component such as another polymer, a light absorbing compound, a rheology controlling agent, and a surfactant, if necessary.

Examples of that another polymer include a polymer produced from an addition polymerizable compound. Specific examples thereof include addition polymerization polymers produced from addition polymerizable compounds such as a acrylate compound, a methacrylate compound, a acrylamide compound, a methacrylamide compound, a vinyl compound, a styrene compound, a maleimide compound, maleic anhydride, and acrylonitrile. Further examples thereof include polyester, polyamide, polyimide, polyamic acid, polycarbonate, polyether, phenol novolac, cresol novolac, and naphthol novolac. When that another polymer is used, the use amount thereof in the solid content is, for example, 0.1 to 40% by mass.

The light absorbing compound can be used without particular limitation as long as it has high absorptive power for light at a photosensitive wavelength region of a photosensitive component in a photoresist layer provided on the resist underlayer film. As the light absorbing compound, a benzophenone compound, a benzotriazole compound, an azo compound, a naphthalene compound, an anthracene compound, an anthraquinone compound, a triazine compound, a triazinetrione compound, a quinoline compound, or the like, can be used. In particular, a naphthalene compound, an anthracene compound, a triazine compound, or a triazinetrione compound can be used. Specific examples thereof include 1-naphthalenecarboxylic acid, 2-naphthalenecarboxylic acid, 1-naphthol, 2-naphthol, naphthylacetic acid, 1-hydroxy-2-naphthalenecarboxylic acid, 3-hydroxy-2-naphthalenecarboxylic acid, 3,7-dihydroxy-2-naphthalenecarboxylic acid, 6-bromo-2-hydroxynaphthalene, 2,6-naphthalenedicarboxylic acid, 9-anthracenecarboxylic acid, 10-bromo-9-anthracenecarboxylic acid, anthracene-9,10-dicarboxylic acid, 1-anthracenecarboxylic acid, 1-hydroxyanthracene, 1,2,3-anthracenetriol, 9-hydroxymethylanthracene, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, and 2,4,6-tribromo-3-hydroxybenzoic acid. When the light absorbing compound is used, the use amount thereof in the solid content is, for example, 0.1 to 40% by mass.

Examples of the rheology controlling agent include phthalic acid compounds such as dimethyl phthalate, diethyl phthalate, diisobutyl phthalate, dihexyl phthalate, and butylisodecyl phthalate, adipic acid compounds such as di-n-butyl adipate, diisobutyl adipate, diisooctyl adipate, and octyldecyl adipate, maleic acid compounds such as di-n-butyl maleate, diethyl maleate, and dinonyl maleate, oleic acid compounds such as methyl oleate, butyl oleate, and tetrahydrofurfuryl oleate, and stearic acid compounds such as n-butyl stearate and glyceryl stearate. When the rheology controlling agent is used, the use amount thereof in the solid content is, for example, 0.001 to 10% by mass.

Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including trade name: Eftop EF301, EF303, and EF352 (available from Tohkem products Corporation), trade name: MEGAFACE F171, F173, R-08, and R-30 (available from Dainippon Ink and Chemicals), Fluorad FC430 and FC431 (available from Sumitomo 3M, Ltd.), and trade name: AsahiGuard AG710, and Surflon S-382, SC101, SC102, SC103, SC104, SCI05, and SC106 (available from Asahi Glass Co., Ltd.), and organosiloxane polymer KP341 (available from Shin-Etsu Chemical Co., Ltd.). The surfactants may be used alone, or two or more thereof may be used in combination. When the surfactant is used, the use amount thereof in the solid content is, for example, 0.0001 to 5% by mass.

The solvent used for the resist underlayer film-forming composition of the present invention may be used without particular limitation as long as it is a solvent in which the solid content can be dissolved. Examples of such a solvent include ethylene gylcol monomethyl ether, ethylene gylcol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluen, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. The solvents can be used alone, or two or more thereof can be used in combination. Furthermore, a mixture of solvents having high boiling point such as propylene glycol monobutyl ether and propylene glycol monobutyl ether acetate can be used.

Hereinafter, the use of the resist underlayer film-forming composition of the present invention will be described.

The present invention also relates to a resist underlayer film obtained by applying the resist underlayer film-forming composition of the present invention to a semiconductor substrate, followed by baking, and a method for producing a semiconductor device comprising steps of: applying the resist underlayer film-forming composition of the present invention to a semiconductor substrate, followed by baking, to form a resist underlayer film; forming a photoresist film on the resist underlayer film; forming a resist pattern by exposure and development; etching the resist underlayer film according to the formed resist pattern; and processing the semiconductor substrate according to the patterned resist underlayer film.

Herein, the present invention will be specifically described. First, the resist underlayer film-forming composition of the present invention is applied to a semiconductor substrate (e.g., silicon/silicon dioxide-coated substrate, silicon nitride substrate, glass substrate, and ITO substrate) by an appropriate applying method such as a spinner and a coater, and baked to form a resist underlayer film. A baking condition is appropriately selected from a baking temperature of 80° C. to 250° C. and a baking time of 0.3 to 60 minutes. It is preferable that the baking temperature be 130° C. to 250° C. and the baking time be 0.5 to 5 minutes. The thickness of the formed resist underlayer film is, for example, 0.01 to 3.0 µm, and preferably 0.03 to 1.0 µm, 0.02 to 0.5 µm, or 0.05 to 0.2 µm.

Subsequently, a layer of a photoresist is formed on the resist underlayer film. The layer of a photoresist can be formed by a known method, that is, by applying a photoresist composition solution to the resist underlayer film, followed by baking.

The photoresist applied to and formed on the resist underlayer film of the present invention is not particularly limited as long as it is sensitive to exposure light. Any of a negative photoresist and a positive photoresist can be used. Examples of the photoresist include a positive photoresist including a novolac resin and 1,2-naphthoquinone diazide sulfonic acid ester, a chemically amplified photoresist including a binder having a group that increases an alkali dissolution rate by decomposition with an acid and a photoacid generator, a chemically amplified photoresist including a low molecular compound that increases an alkali dissolution rate of the photoresist by decomposition with an acid, an alkali-soluble binder, and a photoacid generator, and a chemically amplified photoresist including a binder having a group that increases an alkali dissolution rate by decomposition with an acid, a low molecular compound that increases the alkali dissolution rate of the photoresist by decomposition with the acid, and a photoacid generator.

Next, exposure through a predetermined mask is carried out. For the exposure, a KrF excimer laser (wavelength: 248 nm), an ArF excimer laser (wavelength: 193 nm), or the like can be used.

After the exposure, post exposure bake (PEB) can be carried out, if necessary. In the post exposure bake, a baking temperature and a baking time are appropriately selected from 70° C. to 150° C. and 0.3 to 10 minutes, respectively.

Subsequently, development by a developer is carried out. For example, when the positive photoresist is used, the photoresist at an exposed part is removed to form a pattern of the photoresist.

Examples of the developer include aqueous solutions of alkali metal hydroxides such as potassium hydroxide and sodium hydroxide, aqueous solutions of quaternary ammonium hydroxide such as tetramethylammonium hydroxide, tetraethylammonium hydroxide, and choline, and an alkaline aqueous solution including aqueous solutions of amines such as ethanolamine, propylamine, and ethylenediamine. Furthermore, a surfactant or the like can be added to the developer. A development condition is appropriately selected from a temperature of 5 to 50° C. and a time of 10 to 300 seconds.

The removal of the resist underlayer film and the processing of the semiconductor substrate is carried out using the formed photoresist pattern as a protective film. The removal of the resist underlayer film is carried out using a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, or chlorine trifluoride.

Before the resist underlayer film of the present invention is formed on the semiconductor substrate, a flatting film or a gap-filling material layer may be formed. When there is a large step or a semiconductor substrate having a hole is used, it is preferable that the flatting film or the gap-filling material layer be formed.

The semiconductor substrate to which the resist underlayer film-forming composition of the present invention is applied may have an inorganic anti-reflective coating that is formed by a CVD method or the like on the surface. On the anti-reflective coating, the resist underlayer film of the present invention can be formed.

The resist underlayer film of the present invention may be used as a layer of preventing an interaction of the substrate with the photoresist, a layer having a function of preventing an adverse effect on the substrate due to materials used in the photoresist or substances produced during exposure of the photoresist, a layer having a function of preventing diffusion of substances produced from the substrate during heating or baking in an upper-layer photoresist, or a barrier layer for reducing a poisoning effect of the photoresist layer by a semiconductor substrate dielectric layer.

The resist underlayer film formed from the resist underlayer film-forming composition is applied to a substrate with a via hole used in a dual damascene process. The resist underlayer film can be used as an embedding material with which the hole is filled without space. Furthermore, the resist underlayer film can also be used as a flatting material for flatting a rough surface of the semiconductor substrate.

Hereinafter, the present invention will be more specifically described with reference to Examples, but the present invention is not limited to the Examples.

EXAMPLES

A weight average molecular weight shown in the following Synthesis Examples is a result measured by gel permeation chromatography (hereinafter abbreviated as GPC). In the measurement, a GPC device manufactured by TOSOH CORPORATION was used, and measurement conditions are as follows. A degree of distribution shown in the following Synthesis Examples is calculated from the measured weight average molecular weight and a number average molecular weight.

GPC column: Shodex (registered trademark) Asahipak (registered trademark) (manufactured by Showa Denko K.K.)
Column temperature: 40° C.
Solvent: N,N-dimethyl formamide (DMF)
Flow rate: 0.6 mL/min
Standard sample: standard polystyrene sample (manufactured by TOSOH CORPORATION)
Detector: RI detector (RI-8020 manufactured by TOSOH CORPORATION)

Synthesis Example 1

In a reactor, 3 g of 1,3-diglycidyl-5,5-dimethylhydantoin, 0.71 g of diglycidyl resorcinol ether, 1.82 g of fumaric acid, 0.29 g of ethyltriphenylphosphonium bromide, and 0.008 g of hydroquinone were added to 13.6 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-1). The weight average molecular weight in terms of standard polystyrene was 6,730.

Synthesis Example 2

In a reactor, 3 g of 1,3-diglycidyl-5,5-dimethylhydantoin, 0.41 g of isophthalic acid, 1.16 g of fumaric acid, 0.23 g of ethyltriphenylphosphonium bromide, and 0.007 g of hydroquinone were added to 11.6 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-2). The weight average molecular weight in terms of standard polystyrene was 8,537.

Synthesis Example 3

In a reactor, 3 g of 1,3-diglycidyl-5,5-dimethylhydantoin, 1.22 g of 2,6-naphthalene dicarboxylic acid diglycidyl ester, 1.82 g of fumaric acid, 0.29 g of ethyltriphenylphosphonium bromide, and 0,008 g of hydroquinone were added to 13.9 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-3), The weight average molecular weight in terms of standard polystyrene was 4,018.

Synthesis Example 4

In a reactor, 5.0 g of 1,3-diglycidyl-5,5-dimethylhydantoin, 1.44 g of terephthalic acid diglycidyl ester (trade name: Denacol EX711, available from Nagase ChemteX Corporation), 2.91 g of fumaric acid, 0.46 g of ethyltriphenylphosphonium bromide, and 0.013 g of hydroquinone were added to 22.9 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-4). The weight average molecular weight in terms of standard polystyrene was 6,730.

Synthesis Example 5

In a reactor, 4.0 g of monoallyl diglycidylisocyanuric acid (available from Shikoku Chemicals Corporation), 0.81 g of diglycidyl resorcinol ether, 2.08 g of fumaric acid, 0.33 g of ethyltriphenylphosphonium bromide, and 0.01 g of hydroquinone were added to 16.86 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-5). The weight average molecular weight in terms of standard polystyrene was 17,526.

Synthesis Example 6

In a reactor, 4.0 g of monoallyl diglycidylisocyanuric acid (available from Shikoku Chemicals Corporation), 1.39 g of diglycidyl resorcinol ether, 2.38 g of fumaric acid, 0.38 g of ethyltriphenylphosphonium bromide, and 0.011 g of hydroquinone were added to 19.03 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-5). The weight average molecular weight in terms of standard polystyrene was 13,255.

Synthesis Example 7

In a reactor, 4.0 g of monoallyl diglycidylisocyanuric acid (available from Shikoku Chemicals Corporation), 0.52 g of 5-hydroxyisophthalic acid, 1.33 g of fumaric acid, 0.26 g of ethyltriphenylphosphonium bromide, and 0.008 g of hydroquinone were added to 14.2 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (3-6). The weight average molecular weight in terms of standard polystyrene was 14,138.

Comparative Synthesis Example 1

In a reactor, 3 g of 1,3-diglycidyl-5,5-dimethylhydantoin, 1.45 g of fumaric acid, 0.23 g of ethyltriphenylphosphonium bromide, and 0.007 g of hydroquinone were added to 10.9 g of propylene glycol monomethyl ether and dissolved. The reactor was purged with nitrogen, and a reaction was caused at 135° C. for 4 hours to obtain a polymer solution. The polymer solution was not clouded even by cooling to room temperature. The polymer solution has good solubility in propylene glycol monomethyl ether. The obtained polymer was analyzed by GPC and was found to correspond to Formula (4-1). The weight average molecular weight in terms of standard polystyrene was 7,469.

Formula (4-1)

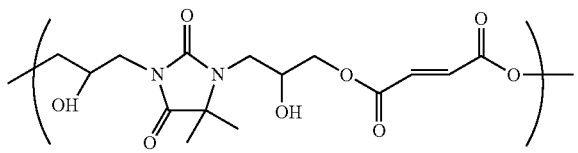

Example 1

0.15 g of tetramethoxymethyl glycoluril (trade name: POWDERLINK (registered trademark) 1174, available from Nihon Cytec Industries Inc.) and 0.015 g of 5-sulfosalicylic acid were mixed in 2.0 g of solution containing 0.6 g of the polymer obtained in Synthesis Example 1. To the mixture, 26.9 g of propylene glycol monomethyl ether was added and dissolved. Subsequently, the solution was filtered through a microfilter made of polyethylene with a pore diameter of 0.05 μm to obtain a resist underlayer film-forming composition for lithography.

Examples 2 to 7

0.15 g of tetramethoxymethyl glycoluril (trade name: POWDERLINK (registered trademark) 1174, available from Nihon Cytec Industries Inc.) and 0.015 g of 5-sulfosalicylic acid were mixed in 2.0 g of solution containing 0.6 g of the polymer obtained in each of Synthesis Examples 2 to 7, To each mixture, 26.9 g of propylene glycol monomethyl ether was added and dissolved. Subsequently, each solution was filtered through a microfilter made of polyethylene with a pore diameter of 0.05 μm to obtain each resist underlayer film-forming composition for lithography.

Comparative Example 1

0.15 g of tetramethoxymethyl glycoluril (trade name: POWDERLINK (registered trademark) 1174, available from Nihon Cytec Industries Inc.) and 0.015 g of 5-sulfosalicylic acid were mixed in 2.0 g of solution containing 0.6 g of the polymer obtained in Comparative Synthesis Example 1. To the mixture, 26.9 g of propylene glycol monomethyl ether was added and dissolved. Subsequently, the solution was filtered through a microfilter made of polyethylene with a pore diameter of 0.05 μm to obtain a resist underlayer film-forming composition for lithography.

(Measurement of Optical Parameter)

Each resist underlayer film-forming substance for lithography prepared in Examples 1 to 7 was applied to a silicon wafer using a spinner. The silicon wafer was disposed on a hot plate, and baked at 205° C. for 1 minute to form a resist underlayer film (thickness: 0.05 μm). The refractive index (n value) and the extinction coefficient (k value) of each of the resist underlayer films at a wavelength of 193 nm were measured using a spectroscopic ellipsometer (VUV-VASE VU-302 manufactured by J. A. Woollam Co., Inc.).

TABLE 1

|  | Refractive index (n value) | Extinction coefficient (k value) |
|---|---|---|
| Example 1 | 1.58 | 0.23 |
| Example 2 | 1.63 | 0.20 |
| Example 3 | 1.61 | 0.19 |
| Example 4 | 1.61 | 0.25 |
| Example 5 | 1.75 | 0.37 |
| Example 6 | 1.67 | 0.34 |
| Example 7 | 1.85 | 0.33 |

As shown above, the obtained results show that a resist underlayer film obtained from each of the resist underlayer film-forming compositions in Examples 1 to 7 has sufficient refractive index and extinction coefficient to light of 193 nm.

(Elution Test into Photoresist Solvent)

Each resist underlayer film-forming composition for lithography prepared in Examples 1 to 7 and Comparative Example 1 was applied to a silicon wafer as a semiconductor substrate using a spinner. Each silicon wafer was disposed on a hot plate, and baked at 205° C. for 1 minute to form a resist underlayer film (thickness: 0.05 μm). Each resist underlayer film was immersed in ethyl lactate and propylene glycol monomethyl ether as solvents used for a photoresist. It is confirmed that the resist underlayer films are insoluble in the solvents.

(Formation and Evaluation of Resist Pattern)

Each resist underlayer film-forming composition prepared in Examples 1 to 7 and Comparative Example 1 in the specification was applied to a silicon wafer on which a nitrogen-containing silicon oxide film (SiON) had been vapor-deposited using a spinner. The silicon wafer was heated on a hot plate at 205° C. for 1 minute to form a resist underlayer film having a thickness at which reflectance was 1% or less (0.043 μm for Examples 1 to 4 and Comparative Example 1; 0.030 μm for Examples 5 to 7). To the resist underlayer film, a resist solution for ArF excimer laser (product name: AR2772JN, available from JSR Corporation) was applied by spin coating, baked at 110° C. for 90 seconds, and exposed to light with an exposure device for ArF excimer laser (NSR-S307E, manufactured by Nikon Corporation) under a predetermined condition. After the exposure, the wafer was baked (PEB) at 110° C. for 90 seconds, cooled to room temperature on a cooling plate, developed, and rinsed to form a resist pattern.

A line of 80 nm and a space of 100 nm are set as a target line width, and a focus depth margin is investigated. The focus depth margin is determined as follows. Exposure is carried out while the focus position is shifted by 0.01 μm above and below from an optimum focus position as a reference at an optimum exposure dose. A case where all nine lines among nine lines of the photoresist to be formed are formed is determined as "acceptable," and a case where eight or less lines are left is determined as "not acceptable." A vertical width of shift of the focus position in which "acceptable" results can be obtained is taken as focus depth margin.

TABLE 2

|  | Focus depth margin (μm) |
| --- | --- |
| Example 1 | 0.27 |
| Example 2 | 0.24 |
| Example 3 | 0.24 |
| Example 4 | 0.23 |
| Example 5 | 0.24 |
| Example 6 | 0.24 |
| Example 7 | 0.30 |
| Comparative Example 1 | 0.21 |

As described above, the focus depth margins in Examples 1 to 7 are improved as compared with Comparative Example 1.

INDUSTRIAL APPLICABILITY

The present invention can provide an anti-reflective coating having strong absorption for light with a short wavelength, and particularly an ArF excimer laser (wavelength: 193 nm), and a resist underlayer film-forming composition for formation of the anti-reflective coating. The present invention can further provide a resist underlayer film that has a wide focus position range within which a good resist shape can be obtained.

The invention claimed is:

1. A resist underlayer film-forming composition for lithography comprising a linear polymer that is obtained by a reaction of a diepoxy group-containing compound (A) with a dicarboxyl group-containing compound (B), wherein the linear polymer has structures of the following formulae (1), (2), and (3) derived from the diepoxy group-containing compound (A) or the dicarboxyl group-containing compound (B):

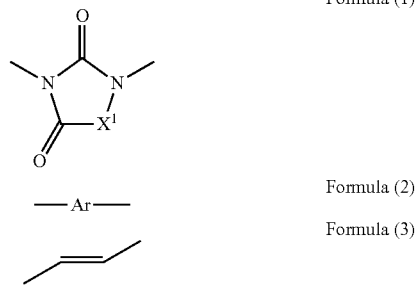

Formula (1)

Formula (2)

Formula (3)

in Formula (1), $X^1$ is a group of Formula (4), (5), or (6):

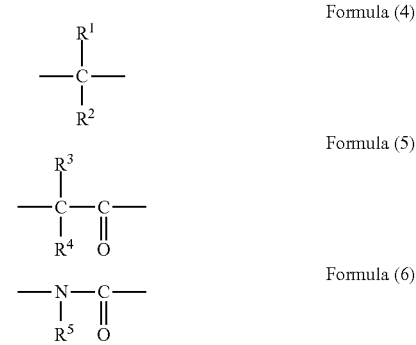

Formula (4)

Formula (5)

Formula (6)

wherein each of $R^1$, $R^2$, $R^3$, and $R^4$ is a hydrogen atom, a $C_{1-6}$ alkyl group, a $C_{3-6}$ alkenyl group, benzyl group, or phenyl group, the phenyl group may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group, and $R^1$ and $R^2$ or $R^3$ and $R^4$ may be bonded to each other to form a $C_{3-6}$ ring; and $R^5$ is a $C_{1-6}$ alkyl group, a $C_{3-6}$ alkenyl group, benzyl group, or phenyl group, and the phenyl group may be substituted by a group selected from the group consisting of a $C_{1-6}$ alkyl group, a halogen atom, a $C_{1-6}$ alkoxy group, a nitro group; a cyano group, a hydroxyl group, and a $C_{1-6}$ alkylthio group; and Ar in Formula (2) is an aromatic $C_{6-20}$ fused ring, and the ring may be substituted by a group selected from the group consisting of a $C_{1-6}$ alkyl group, a halogen atom, a $C_{1-6}$ alkoxy group, a nitro group, a cyano group, a hydroxyl group, and a $C_{1-6}$ alkylthio group, wherein the linear polymer is a polymer obtained by a reaction of two diepoxy group-containing compounds (A), one having the structure of Formula (1) and the other having the structure of Formula (2), with a dicarboxyl group-containing compound (B) having a structure of Formula (3); or the linear polymer is a polymer obtained by a reaction of a diepoxy group-containing compound (A) having a structure of Formula (1) with two dicarboxyl group-containing compounds (B), one having the structure of Formula (2), and the other having the structure of Formula (3).

2. The resist underlayer film-forming composition according to claim 1, wherein $X^1$ in Formula (1) is a group of Formula (4) or (6).

3. The resist underlayer film-forming composition according to claim 1, wherein Ar in Formula (2) is a benzene ring or a naphthalene ring.

4. The resist underlayer film-forming composition according to claim 1, further comprising a crosslinkable compound.

5. The resist underlayer film-forming composition according to claim 1, further comprising an acid and/or an acid generator.

6. A resist underlayer film obtained by applying the resist underlayer film-forming composition as claimed in claim 1 to a semiconductor substrate, followed by baking.

7. The resist underlayer film-forming composition according to claim 1, wherein a solid content of the composition is 0.1 to 70% by mass.

8. The resist underlayer film-forming composition according to claim 1, wherein at least one of the two diepoxy group-containing compounds (A) is selected from the following formulae:

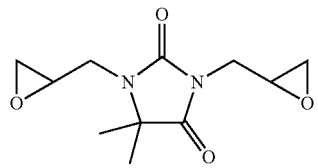

Formula (A-1)

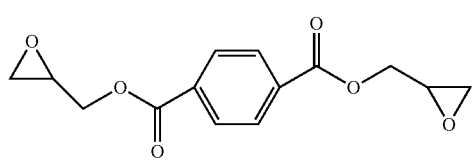

Formula (A-2)

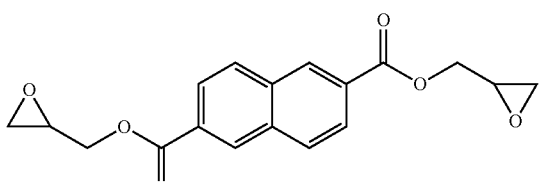

Formula (A-3)

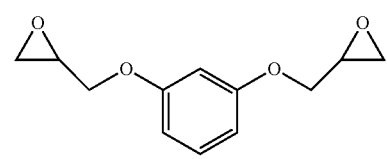

Formula (A-4)

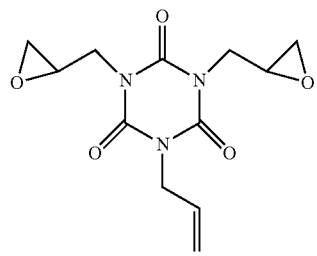

Formula (A-5)

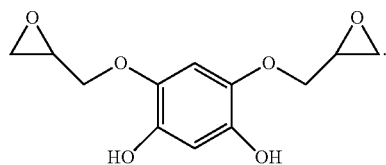

Formula (A-6)

9. The resist underlayer film-forming composition according to claim 1, wherein at least one of the dicarboxyl group-containing compounds (B) is selected from the following formulae:

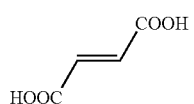

Formula (B-1)

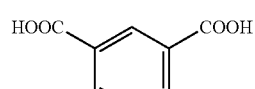

Formula (B-2)

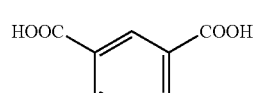

Formula (B-3)

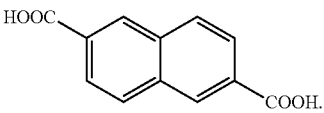

Formula (B-4)

10. The resist underlayer film-forming composition according to claim 1, wherein a molar ratio of the diepoxy group-containing compound having the structure of Formula (1) to the diepoxy group-containing compound having the structure of Formula (2) is in a range of from 1:0.1 to 0.6.

11. The resist underlayer film-forming composition according to claim 1, wherein a molar ratio of the dicarboxyl group-containing compound having the structure of Formula (2) to the dicarboxyl group-containing compound having the structure of Formula (3) is in a range of from 1:1 to 9.

12. A method for producing a semiconductor device comprising:
applying the resist underlayer film-forming composition as claimed in claim 1 to a semiconductor substrate, followed by baking to form a resist underlayer film;
forming a photoresist film on the resist underlayer film;

forming a resist pattern by exposure and development;
etching the resist underlayer film according to the formed resist pattern; and
processing the semiconductor substrate according to the patterned resist underlayer film.

* * * * *